(12) United States Patent
You

(10) Patent No.: US 7,553,715 B2
(45) Date of Patent: Jun. 30, 2009

(54) CRYSTALLIZATION METHOD AND APPARATUS THEREOF

(75) Inventor: JaeSung You, Seoul (KR)

(73) Assignee: LG Display Co., Ltd., Seoul (KR)

( * ) Notice: Subject to any disclaimer, the term of this patent is extended or adjusted under 35 U.S.C. 154(b) by 312 days.

(21) Appl. No.: 11/158,005

(22) Filed: Jun. 22, 2005

(65) Prior Publication Data
US 2006/0003506 A1 Jan. 5, 2006

(30) Foreign Application Priority Data
Jun. 30, 2004 (KR) .................. 10-2004-0050708

(51) Int. Cl.
H01L 21/84 (2006.01)

(52) U.S. Cl. .................. 438/166; 438/487

(58) Field of Classification Search .................. 438/155, 438/487, 166
See application file for complete search history.

(56) References Cited

U.S. PATENT DOCUMENTS 6,396,560 B1 5/2002 Noguchi et al.
7,164,152 B2 * 1/2007 Im .................. 257/64
2003/0164501 A1 9/2003 Suzuki et al.

FOREIGN PATENT DOCUMENTS

WO WO 2004/017381 2/2004

OTHER PUBLICATIONS

Search Report dated Sep. 26, 2005.

* cited by examiner

Primary Examiner—Matthew Smith
Assistant Examiner—Colleen E Rodgers
(74) Attorney, Agent, or Firm—McKenna Long & Aldridge LLP

(57) ABSTRACT

A method of crystallizing an amorphous silicon thin film on a substrate includes loading a substrate onto a stage, the substrate having an amorphous silicon thin film thereon and having first and second regions, performing a first crystallization by irradiating a laser beam on the first region of the amorphous silicon thin film, the first region being crystallized by moving the stage by a first distance, and performing a second crystallization by irradiating the laser beam on the second region, the second region being crystallized by moving the stage by a second distance.

13 Claims, 9 Drawing Sheets

CRYSTALLIZATION METHOD AND APPARATUS THEREOF

The present invention claims the benefit of Korean Patent Application No. 50708/2004 filed in Korea on Jun. 30, 2004, which is hereby incorporated by reference.

BACKGROUND OF THE INVENTION

1. Field of the Invention

The present invention relates to a crystallization method, and particularly, to a laser crystallization method and an apparatus thereof. Although the present invention has a wide scope of applications, it is particularly suitable for which a time for crystallization can be shortened and grains with a desired crystallization characteristic can be obtained at an intended position of a substrate.

2. Description of the Related Art

Recently, as information displays, especially portable information displays, have drawn a great attention, thin and light-weight flat panel display (FPD) devices which can replace existing cathode ray tubes (CRTs) have been actively researched and commercialized. Particularly, of these FPD devices, liquid crystal display (LCD) devices, as devices for displaying images by using optical anisotropic properties of liquid crystal, are widely used for notebook computers or desktop monitors due to their superior resolution, color reproducing capability, image quality or the like.

An active matrix (AM) driving method is generally used for driving LCD devices which use an amorphous silicon thin film transistor (TFT) as a switching element in a pixel unit. The amorphous silicon thin film transistor techniques were established by LeComber in Britain in 1979 and were commercialized as a three-inch liquid crystal portable television in 1986. Recently, a large dimension TFT-LCD device larger than 50 inches has been developed.

However, due to its electrical mobility ($<1$ $cm^2/Vsec$), the amorphous silicon thin film transistor has a limit on its use for peripheral circuits which require a high speed operation of greater than 1 MHz. Thus, researches for simultaneously integrating a pixel unit and a driving circuit unit on a glass substrate using a polycrystalline silicon thin film transistor which has a field effect mobility greater than that of the amorphous silicon thin film transistor have been actively carried out.

The polycrystalline silicon thin film transistor has been applied to small modules, such as camcorders, since liquid crystal display color televisions were developed in 1982. Due to the polycrystalline silicon thin film transistor technique which supports low photosensitivity and provides high electric field effect mobility, driving circuits can be formed directly on a substrate.

Increased mobility can improve an operation frequency of the driving circuit unit which determines the number of pixels that can be driven, and fine minuteness of a display device can be thereby facilitated. In addition, a distortion in a transfer signal is reduced by a decrease in a charging time for a signal voltage of the pixel unit, thereby achieving an improvement in an image quality.

Meanwhile, there are two methods for fabricating the polycrystalline silicon TFT: an as-deposition method in which a polycrystalline silicon thin film is deposited directly on a substrate; and a crystallization method in which an amorphous silicon thin film is deposited on the substrate and then a thermal treatment is carried out. Especially, low temperature processes are required in order to use a low-cost glass substrate, while a method for improving electric field effect mobility of the TFT is required in order to use a polycrystalline silicon thin film transistor for a device of the driving circuit unit.

Among thermal treatment methods for crystallizing the amorphous silicon thin film, an excimer laser annealing method is a typical method for fabricating the polycrystalline silicon thin film at a low temperature. In the excimer laser annealing method, the amorphous silicon thin film is crystallized by instantaneously irradiating a high energy laser beam onto the amorphous silicon thin film for a time of tens of nsec (nanoseconds). In this method, the amorphous silicon thin film is melted and crystallized in a very short time, so that the glass substrate is not damaged.

Hereinafter, a crystallization method using a laser will be explained in detail. FIG. 1 is a graph showing the grain size of a crystallized silicon thin film with respect to the laser energy density to be irradiated.

Referring to FIG. 1, as the laser energy density increases, the grain size of the polycrystalline silicon thin film increases in the first region I and the second region II. However, in the third region III, when an energy density above a specific energy density Ec is irradiated, the grain size of the polycrystalline silicon thin film drastically decreases. This is because a crystallization mechanism for the silicon thin film becomes different according to the irradiated laser energy density, which will be explained in detail as follows.

FIGS. 2A to 2C, 3A to 3C, and 4A to 4C are cross-sectional views illustrating silicon crystallization mechanisms according to the laser energy densities in the graph of FIG. 1. The drawings illustrate sequential crystallization processes according to each laser energy density.

A crystallization mechanism of the amorphous silicon by a laser annealing can be varied with various factors, such as laser irradiation conditions (i.e., laser energy density, irradiation pressure, substrate temperature or the like), physical and geometrical characteristics (i.e., absorption coefficient, thermal conductivity, mass, impurity containing degree, thickness or the like) of the amorphous silicon thin film and so on.

First, as illustrated in FIGS. 2A to 2C, the first region I of the graph shown in FIG. 1 is a partial melting region, and an amorphous silicon thin film 12 is crystallized only down to the dotted line, as shown in FIG. 2B. The size of a grain 30 formed at this time is about hundreds Å (angstrom).

That is, when a laser beam of the first region I is irradiated onto the amorphous silicon thin film 12 on a substrate 10 on which a buffer layer 11 is formed, the amorphous silicon thin film 12 melts. At this time, a strong laser energy is irradiated at the surface of the amorphous silicon thin film 12 which is directly exposed to the laser beam, and a relatively weak laser energy is irradiated at a lower portion of the amorphous silicon thin film 12. As a result, the amorphous silicon thin film 12 melts only down to a certain portion 12', so as to achieve a partial crystallization.

In the laser crystallization method, processes of a crystalline growth include a primary melting in which the amorphous silicon surface layer is melted by a laser irradiation, a second melting in which a lower layer is melted by a latent heat generated during the solidification of the primary melting layer, and a crystal growth by the solidification. These crystal growth processes will now be described in detail.

An amorphous silicon thin film on which a laser beam is irradiated has a melting temperature of higher than 1000° C. and primarily melts into a liquid state. Afterwards, because there occurs a large temperature difference between the primary melting layer and the lower silicon and substrate, the primary melting layer is cooled down fast until a solid phase nucleation and a solidification occur. The melted layer by the laser bream irradiation remains until the solid phase nucleation and the solidification are completed. Thus, the melting state lasts for a long time when the laser energy density is high or thermal emission to the outside is low at a range where an ablation does not occur.

Furthermore, the primary melting layer melts at a temperature (1000° C.) lower than the melting temperature (1400° C.) for crystalline silicon, and thus the melted layer is cooled down and maintains a super-cooled state where the temperature is lower than the phase transition temperature. When the super-cooled state is great, namely, when the melting temperature of the thin film is low or the cooling speed is fast, a nucleation rate at the time of the solidification becomes great, so as to achieve a fine crystal growth.

Once the primary melting layer is cooled down as the solidification starts, the crystals grow in an upward direction from a crystal nucleus. As the primary melting layer transforms its phase from a liquid state to a solid state, the latent heat is discharged. As a result, the secondary melting begins to melt the lower amorphous silicon thin film in the solid state and then the solidification occurs again. Thus, this procedure is repeated to grow crystals. The lower secondary melting layer is more super-cooled than the primary melting layer. Accordingly, the nucleation rate increases to make the size of the crystal smaller.

Therefore, reducing the cooling speed is an effective method of improving characteristics of the crystallization in the solidification when performing the crystallization by the laser annealing. The cooling speed can be reduced by preventing heat of the absorbed laser energy from being emitted to the exterior, examples of which are heating the substrate, irradiating double beam, inserting a buffer insulating layer or the like.

FIGS. 3A through 3C are cross-sectional views sequentially showing the silicon crystallization mechanism corresponding to the second region II of the graph shown in FIG. 1. The second region II indicates a near-complete melting region.

As shown in the drawings, a polycrystalline silicon thin film has relatively large grains 30A to 30C of about 3000 to 4000 Å and is formed down to the interface of a lower buffer layer 11. That is, when a near-complete melting energy, but not a complete melting energy, is irradiated on the amorphous silicon thin film 12, the amorphous silicon thin film 12 adjacent to the buffer layer 11 melts. At this time, solid seeds 35 which have not been melted exist at the interface between the melted silicon thin film 12' and the buffer layer 11. The seeds act as a crystallization nucleus to induce a lateral growth, thereby forming relatively large-size grains 30A to 30C.

However, because this crystallization method can be used only when the laser energy is such that the non-melted solid seeds 35 can remain on the interface with the buffer layer 11, the process window (i.e., process margin) is disadvantageously very limited. In addition, the solid seeds 35 are generated non-uniformly and accordingly the crystallized grains 30A to 30C of the polycrystalline silicon thin film may have different crystallization directions and different crystallization characteristics.

Now, FIGS. 4A through 4C are cross-sectional views illustrating the crystallization mechanism of a complete melting region corresponding to the third region III of the graph shown in FIG. 1. As shown in the drawings, very small grains 30 are irregularly formed with an energy density corresponding to the third region III.

That is, when the laser energy density is higher than a specific energy density level Ec, a sufficient energy is applied to the amorphous silicon thin film 12 to completely melt the amorphous silicon thin film 12. As a result, solid seeds which may be grown to grains do not remain thereon. Thereafter, the melted silicon thin film 12' which has been melted by receiving the strong laser energy undergoes a rapid cooling process, which leads to a uniform nucleus 30 generation and the fine grains 30.

On the other hand, an excimer laser annealing method employing a pulse type laser is generally used for the laser crystallization. However, a sequential lateral solidification (SLS) method in which the crystallization characteristics are dramatically improved by growing grains in a horizontal direction has been proposed.

The sequential lateral solidification (SLS) method utilizes the fact that the grain grows from an interface between liquid phase silicon and solid phase silicon in a perpendicular direction of the boundary surface. Here, the SLS is such a crystallization method in which the size of the silicon grain can be increased by appropriately controlling the size of the laser energy and an irradiation range of a laser beam, and thus growing the grains laterally as long as a predetermined length.

As the SLS is an example of the lateral solidification, the crystallization mechanism for the lateral solidification will now be described with reference to FIGS. 5A through 5C. FIGS. 5A through 5C are cross-sectional views sequentially illustrating a crystallization process according to the lateral solidification.

First, as illustrated in FIG. 5A, when a laser energy above an energy density at which an amorphous silicon thin film 112 completely melts (i.e., the third region III of the graph shown in FIG. 1) is irradiated onto the amorphous silicon thin film 112, a portion of the amorphous silicon thin film 112 onto which the laser energy is irradiated completely melts. In this method, a laser-irradiated region and a laser non-irradiated region can be formed by using a patterned mask.

At this time, as illustrated in FIGS. 5B and 5C, because a sufficient energy is irradiated onto the amorphous silicon thin film 112, the amorphous silicon thin film 112 completely melts. However, because the laser beam is irradiated with certain intervals, the silicon thin film 112 at the laser non-irradiated region and the solid silicon existing at the interface with the melted silicon thin film 112' act as nucleuses for a crystal growth.

That is, the melted silicon thin film 112' begins to cool from the left/right surfaces, namely, the laser non-irradiated region, immediately after the laser beam is completely irradiated. This is because the solid phase amorphous silicon thin film 112 positioned at the left/right surfaces has a heat conductivity higher than the buffer layer 111 or the glass substrate 110 at the lower portion of the silicon thin films 112 and 112'.

Therefore, the melted silicon thin film 112' first reaches a nucleation temperature at the interface between the solid phase and the liquid phase positioned at the left/right sides, rather than the central portion, thereby forming a crystal nucleus at the corresponding portion. After the crystal nucleus is formed, the grains 130A and 130B laterally grow from a low-temperature side to a high-temperature side, namely, from the interface to the central portion 136.

Thus, large-size grains 130A and 130B are formed by the lateral crystal growth, and the process window (i.e., process margin) is advantageously wide (not limited) because the process is performed with an energy density of the third region III.

However, the SLS method must perform the crystallization by infinitesimally and repeatedly moving the mask or a stage in order to increase the size of the grains. Thus, it takes a long time to crystallize a large-size silicon film, and accordingly the whole process time may be lengthened and the process yield becomes lower.

SUMMARY OF THE INVENTION

Accordingly, the present invention is directed to a crystallization method and an apparatus thereof to shorten a time for crystallization and obtain a grain with desired crystallization characteristic at an intended position of a substrate.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a method of crystallizing an amorphous silicon thin film on a substrate includes loading a substrate onto a stage, the substrate having an amorphous silicon thin film thereon and having first and second regions, performing a first crystallization by irradiating a laser beam on the first region of the amorphous silicon thin film, the first region being crystallized by moving the stage by a first distance, and performing a second crystallization by irradiating the laser beam on the second region, the second region being crystallized by moving the stage by a second distance.

In another embodiment according to the present invention, an apparatus for crystallizing an amorphous silicon thin film on a substrate having a first region and a second region includes a stage on which the substrate is loaded, and a laser system for synchronizing a triggering signal of a laser pulse with a movement speed of the stage to selectively crystallize the first and second regions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

Figure 1:
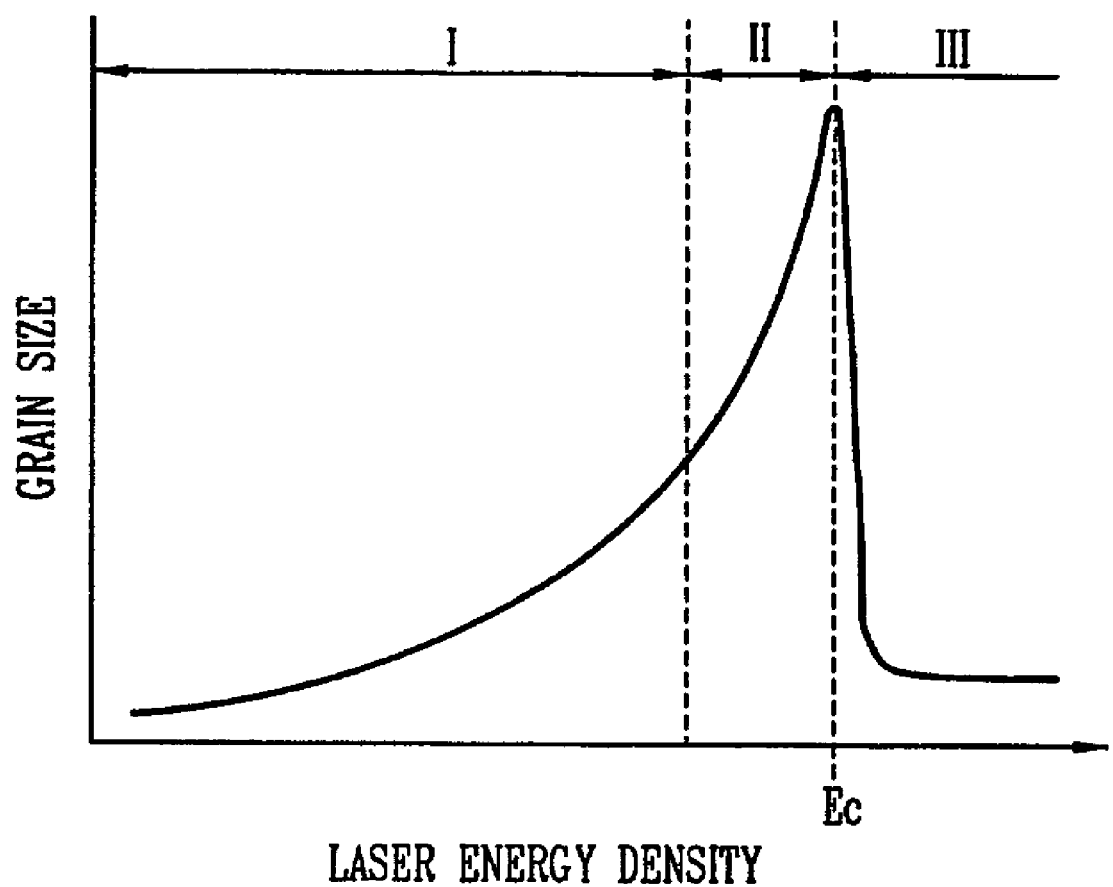
FIG. 1 is a graph showing a grain size of a crystallized silicon thin film with respect to an energy density of a laser irradiation.
Figure 2A:
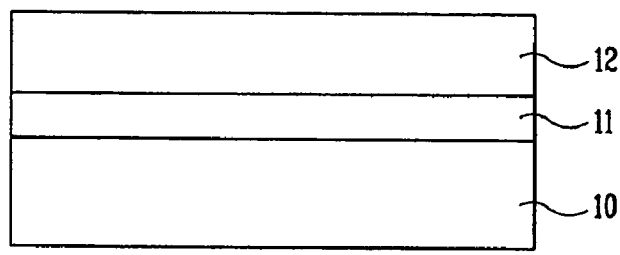
FIGS. 2A to 2C, 3A to 3C, and 4A to 4C are cross-sectional views illustrating silicon crystallization mechanisms according to the laser energy densities in the graph shown in FIG. 1.
Figure 2B:
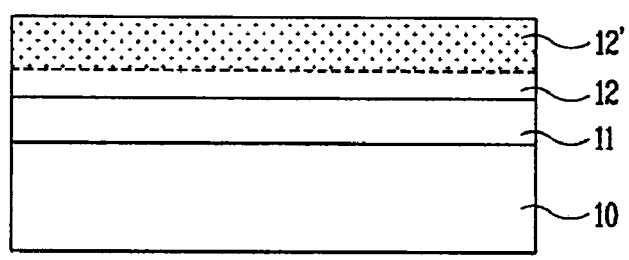
Figure 2C:
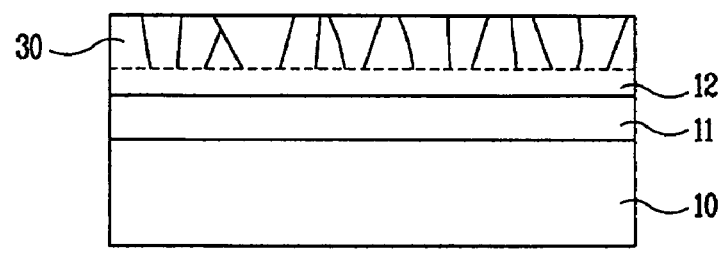
Figure 3A:
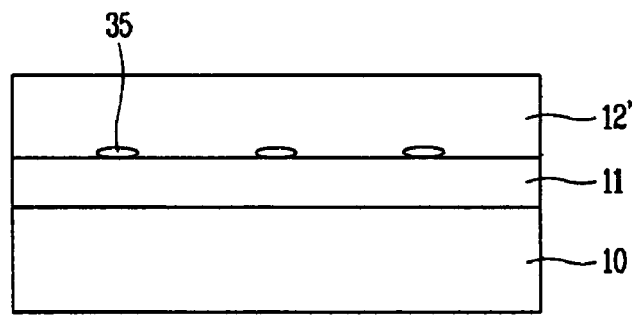
Figure 3B:
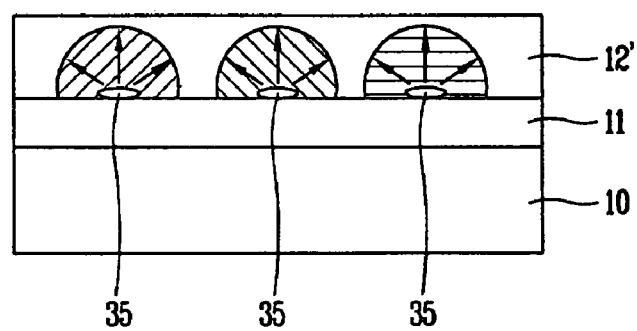
Figure 3C:
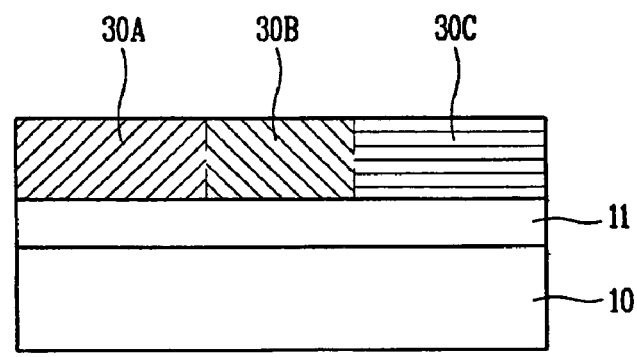
Figure 4A:
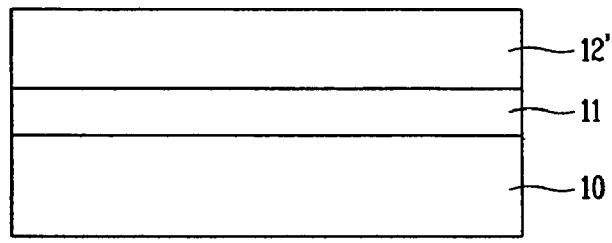
Figure 4B:
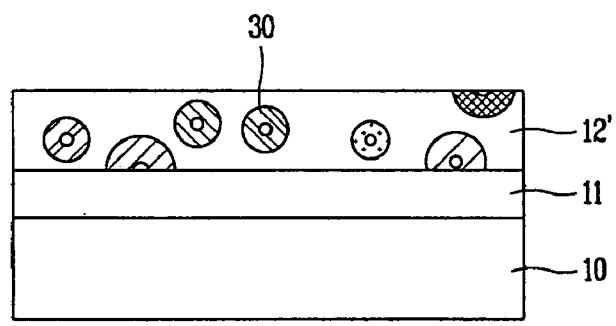
Figure 4C:
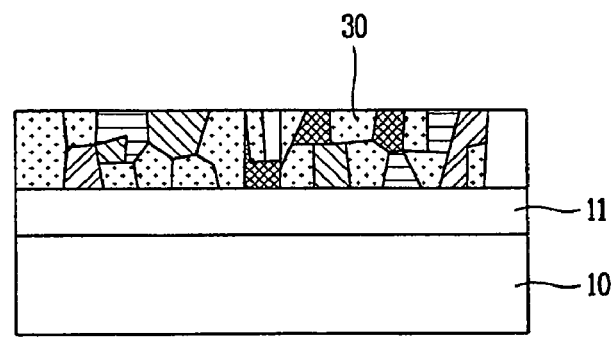
Figure 5A:
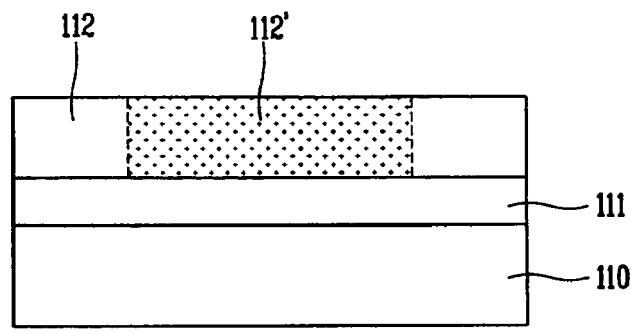
FIGS. 5A to 5C are cross-sectional views sequentially illustrating a crystallization process according to the lateral solidification.
Figure 5B:
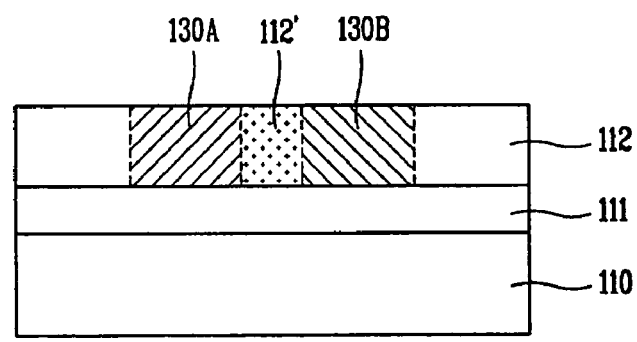
Figure 5C:
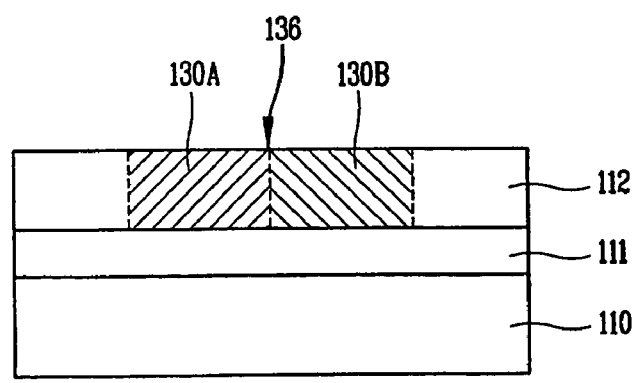
Figure 6:
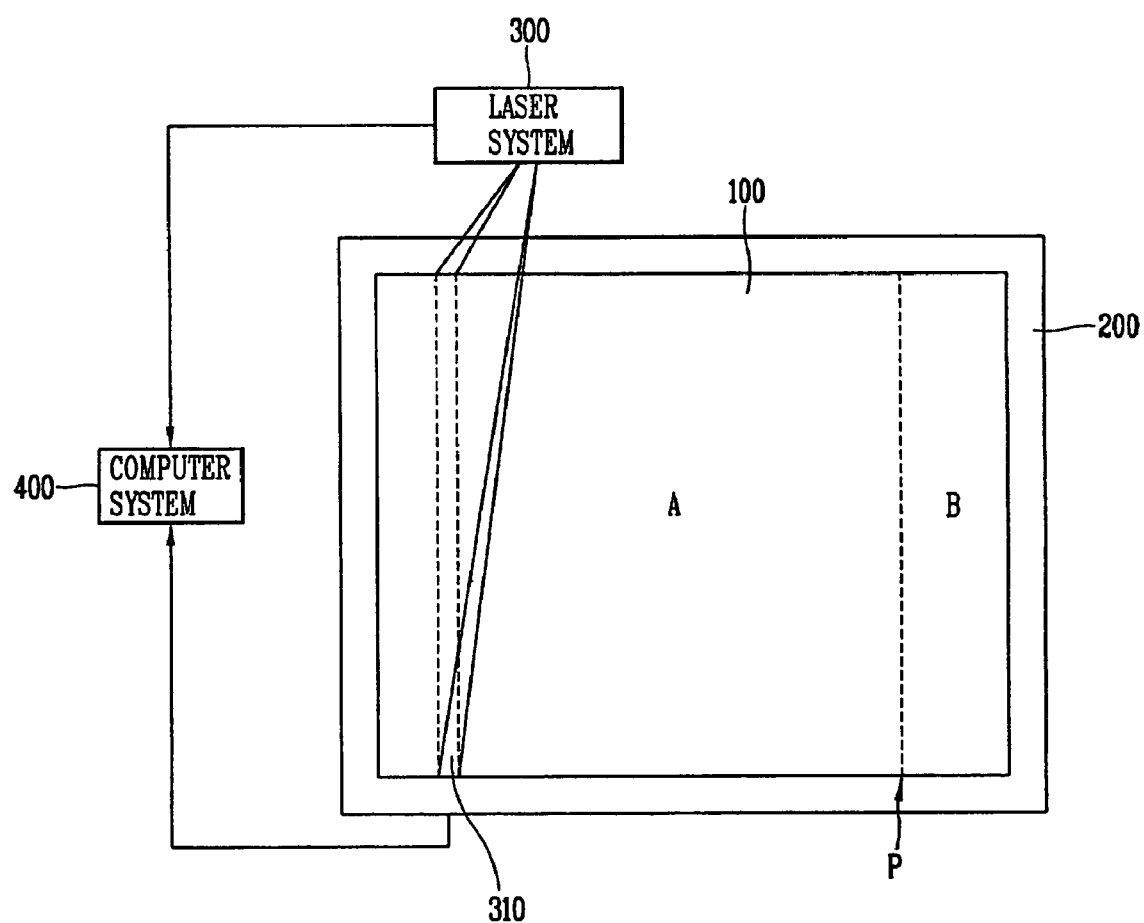
FIG. 6 is an exemplary view schematically showing a crystallization apparatus according to an embodiment of the present invention.

FIG. 6 is an exemplary view schematically illustrating a crystallization apparatus according to an embodiment of the present invention.

As illustrated in FIG. 6, a glass substrate 100 for carrying out a first crystallization is loaded on a stage 200 which can move in the left/right and up/down directions. A laser system 300 for progressing a sequential lateral solidification is positioned on the glass substrate 100. As a result, a laser pulse is generated at a certain interval according to a movement of the stage 200 or the laser system 300 to irradiate a linear laser beam 310 on the surface of the glass substrate 100.

For instance, the stage 200 on which the glass substrate 100 is loaded moves with a constant speed. For a sequential lateral solidification, the laser system 300 generates a laser pulse at a certain interval according to a movement of the stage 200 and then irradiates the laser beam 310 on the glass substrate 100. As a result, the entire region of the glass substrate 100 can be crystallized.

The glass substrate 100 may be an array substrate 100 which can be used for fabricating a liquid crystal display device. In addition, a driving circuit-integrated liquid crystal display device can be fabricated by simultaneously integrating a pixel unit and a driving circuit unit on the array substrate 100.

The array substrate 100 of the driving circuit-integrated liquid crystal display device includes a pixel unit A as an image display region in which unit pixels (not shown) are arranged in a matrix configuration and a driving circuit unit B positioned at the outside of the pixel unit A. In FIG. 6, A is defined as a region for the array substrate 100 in which the pixel unit is formed while B is defined as a region for the array substrate 100 in which the driving circuit unit is formed. However, an embodiment of the present invention is not limited thereto and the pixel unit A and the driving circuit unit B may be formed in other types at other positions of the array substrate 100 according to a design thereof.

Furthermore, although not shown, the pixel unit A of the array substrate 100 includes a plurality of gate lines and data lines crossing each other to define a plurality of unit pixel regions on the substrate 100, thin film transistors, which are used as switching devices, formed near each crossing between the gate lines and data lines, and pixel electrodes formed within the unit pixel regions.

As a switching device for applying and blocking a signal voltage to/from the pixel electrode, the thin film transistor is a field effect transistor (FET) for controlling a flow of current by an electric field.

The driving circuit unit B of the array substrate 100 is divided into a gate driving circuit unit and a data driving circuit unit, and uses a thin film transistor with a CMOS (complementary metal oxide semiconductor) structure which is an inverter for appropriately outputting a signal inputted from the gate driving circuit unit and the data driving circuit unit.

The gate driving circuit unit and the data driving circuit unit, which are devices for supplying a scan signal and a data signal to the pixel electrode through the gate line and the data line, respectively, are connected to an external signal input terminal (not shown), so as to control an external signal transmitted through the external signal input terminal and output it to the pixel electrode.

In such configured driving circuit-integrated liquid crystal display device, an actual area for the driving circuit unit B, although it depends on a resolution and a size of the liquid crystal display device, is much smaller than an area for the pixel unit A. Therefore, when a crystallization process is carried out only with respect to the driving circuit unit B by using a crystallization method with superior crystallization characteristics, the sequential lateral solidification process can be effectively used in spite of its low throughout.

Thus, in order to increase the throughout thereof, a first crystallization which has a low crystallization characteristic but a fast crystallization time is carried out in the region of the pixel unit A that does not require a high device performance, while a second crystallization which has a high crystallization characteristic is carried out in the region of the driving circuit unit B that requires a relatively high device performance by using the same laser system 300. As a result, the crystallization time can be shortened and the crystallization can be suitably performed to have the crystallization characteristic desired in an intended position of the glass substrate 100.

For this purpose, the stage 200 moves at different speeds with respect to each region A and B of the glass substrate 100 according to the desired crystallization characteristics, and a triggering signal of the laser system 300 is synchronized with a movement speed of the stage 200, so as to irradiate a linear laser beam 310 onto the surface of the glass substrate 100.

Thus, the reason why the movement speed of the stage 200 is differently controlled according to the crystallization of the pixel unit A and the driving circuit unit B (i.e., the movement speed in the pixel unit A is set to be faster than that in the driving circuit unit B) is that the pixel unit A requires a fast throughout and the driving circuit unit B requires a superior device characteristic. According to this, the first crystallization process and the second crystallization process corresponding to each characteristic of the pixel unit A and the driving circuit unit B are selectively carried out. As a result, the entire crystallization time can be reduced and grains which have desired characteristics can be obtained in intended positions of the glass substrate 100.

As shown in FIG. 6, for the crystallization of the array substrate 100 which is divided into the region A and the region B, first, the region of the pixel unit A of the array substrate 100 is crystallized by a first crystallization process which has a fast throughout, which will now be explained with reference to FIGS. 7A to 7C in detail.

Figure 7A:
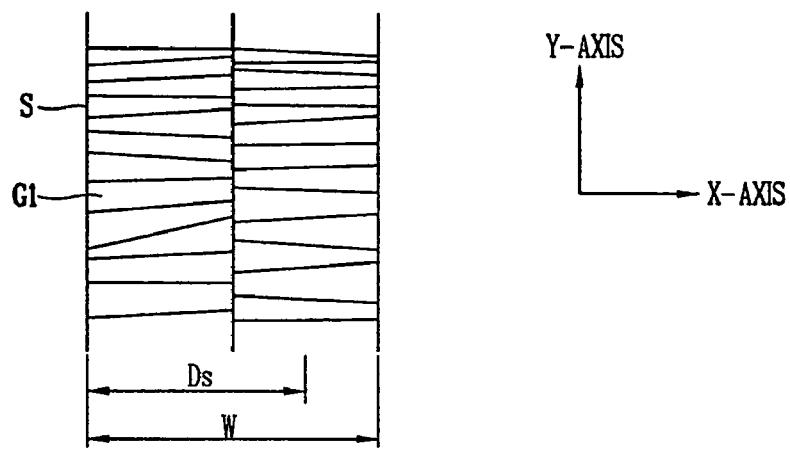
FIGS. 7A to 7C are exemplary views sequentially illustrating a first crystallization process according to an embodiment of the present invention.
Figure 7B:
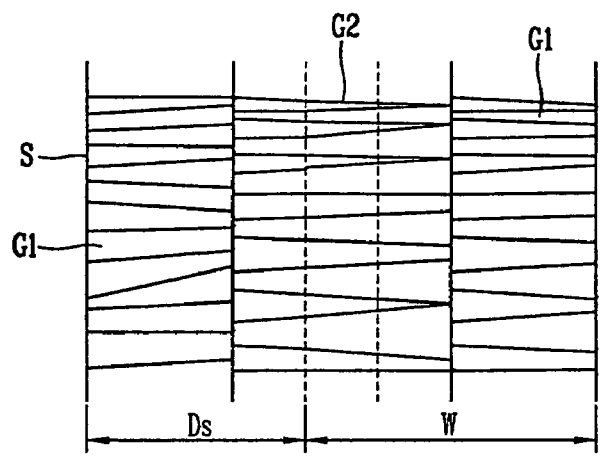
Figure 7C:
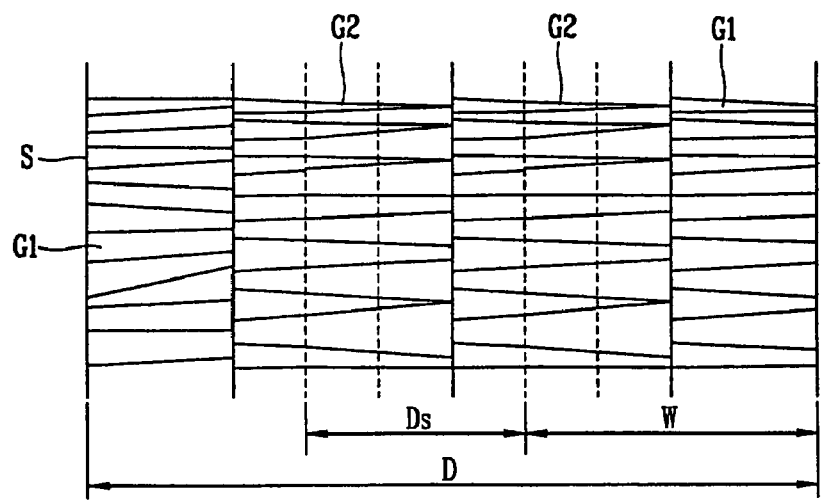

FIGS. 7A to 7C are exemplary views sequentially illustrating a first crystallization process according to an embodiment of the present invention.

When a crystallization process is carried out by irradiating a linear beam with a certain length and a width W on a silicon thin film of the pixel unit region, as illustrated in FIG. 7A, a primary grain G1 with a length corresponding to a half of the beam width W grows in a width direction of the line beam (i.e., the X direction).

That is, seeds S which may be grown to grains are formed at a boundary between an amorphous silicon region on which a laser beam is not irradiated and a silicon region melted by irradiating the laser beam. Due to cooling of the melted silicon thin film, the seed S grows toward a center, so as to form the primary grain G1 which has laterally grown.

Afterwards, the stage on which the array substrate is loaded moves with a uniform speed in the X direction. In the first crystallization process, when a scanning distance Ds that the stage moves at one time is established to be longer than a half of the beam width W and the scanning distance Ds is synchronized with a movement speed of the stage, thereby triggering a laser pulse, as illustrated in FIG. 7B, so that a secondary grain G2 which has the same length as the scanning distance Ds can be obtained.

That is, the secondary grain G2 grows from a certain region of the primary grain G1 on which a laser beam is overlapped and irradiated, thereby having the length of the scanning distance Ds.

Here, in order to crystallize the entire region in the first crystallization process, the scanning distance Ds should not be established to be longer than the beam width W. In other words, the first crystallization process controls the laser pulse to be triggered in the condition of $W/2<Ds<W$. Thus, the triggering signal of the laser pulse can be controlled by synchronizing it with the laser pulse using a computer 400 (shown in FIG. 6) with respect to the stage which moves with a uniform speed.

Afterwards, when the first crystallization process is carried out once more by moving the stage in the X direction as long as the scanning distance Ds, as illustrated in FIG. 7C, a crystallized silicon thin film including the secondary grain G2 as long as the length of the scanning distance Ds which has grown toward the X direction can be obtained.

In this process, when the scanning distance Ds is established as $3W/4$, a length D of a crystallization region which can be obtained by irradiating laser shots totally three times corresponds to $5W/2$. When the entire region of the pixel unit of the array substrate is crystallized by performing the first crystallization process several times, a second crystallization process will be carried out as follows.

Figure 8A:
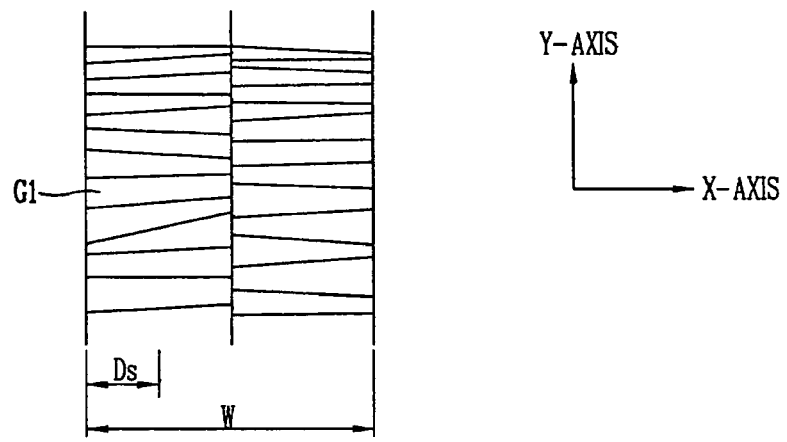
FIGS. 8A to 8C are exemplary views sequentially illustrating a second crystallization process according to an embodiment of the present invention.
Figure 8B:
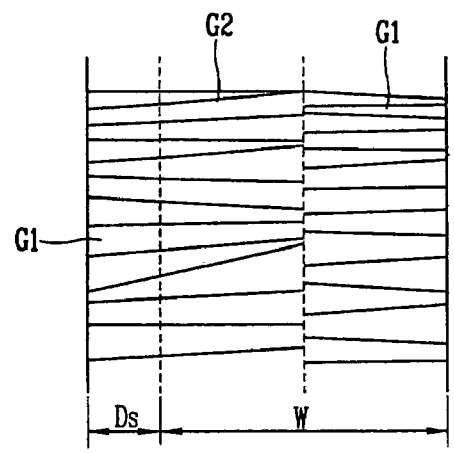
Figure 8C:
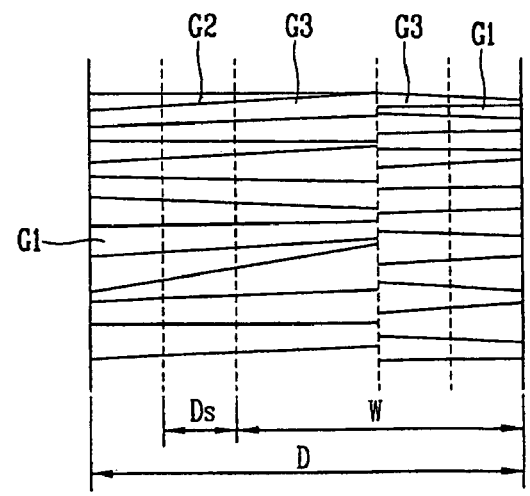

FIGS. 8A to 8C are exemplary view sequentially illustrating a second crystallization process according to an embodiment of the present invention.

Referring to FIG. 8A, in order to crystallize a driving circuit unit which requires a superior device characteristic, when a laser beam having a width W is irradiated on a silicon thin film of the driving circuit unit region for crystallization, a first grain G1 having a length corresponding to a half of the beam width W grows toward a width direction (X direction) of the line beam.

Afterwards, the stage on which the array substrate is loaded moves toward the X direction with a uniform speed. In the second crystallization process according to an embodiment of the present invention, when the scanning distance Ds that the stage moves at one time is established to be shorter than a half of the beam width W and synchronized with a movement speed of the stage to trigger the laser pulse, as illustrated in FIG. 8B, the secondary grain G2 which has a length adding the scanning distance Ds and the length $W/2$ of the primary grain G1 can be obtained.

Thus, in the second crystallization process, since the scanning distance Ds is shorter than the scanning distance of the first crystallization process, a crystallized silicon thin film including the secondary grain G2 with a length longer than that of the primary grain G1 can be obtained by crystallization through a second laser shot. In addition, in the second crystallization process, the laser pulse can be controlled to trigger the condition of $0<Ds<W/2$.

As illustrated in FIG. 8C, when the scanning distance Ds is $W/4$, and the crystallization is carried out by repeating the aforementioned processes, a length D of a crystallization region which can be obtained by irradiating a laser shot three times is $3W/2$. In addition, a crystallized silicon thin film including a tertiary grain G3 with a length of 2Ds+W which has grown toward the X direction can be obtained.

Thus, when carrying out the second crystallization by repeatedly irradiating the laser shot, the length of the grain formed becomes longer and grains (which correspond to such a single crystal level) which have no grain boundary can be obtained, which may be applied to a fabrication for devices of the driving circuit unit.

As shown in those drawings, when the scanning distance is 3W/4 in the first crystallization and 1/W in the second crystallization, a crystallization can be performed in the first crystallization process with a throughout approximately three times as fast as that in the second crystallization process. As a result, in the first crystallization process, the pixel unit which takes the most space of the array substrate can be crystallized in a fast time, and accordingly a time for the entire crystallization process can be shortened.

A method for fabricating a liquid crystal display device by using a polycrystalline silicon thin film which is selectively crystallized to achieve desired crystallization characteristics will now be described as follows.

Figure 9:
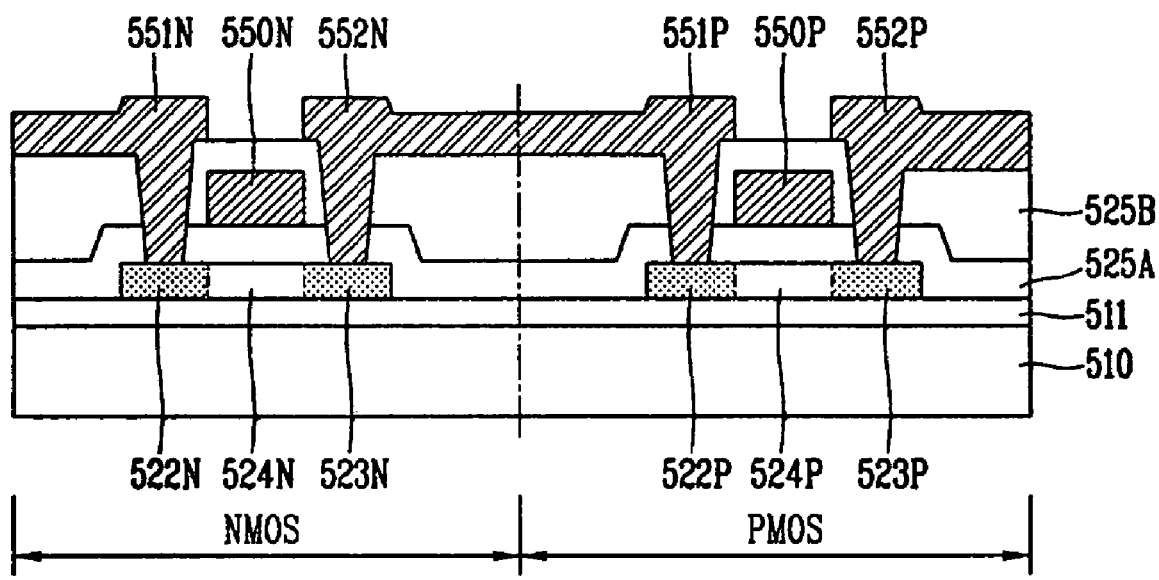
FIG. 9 is an exemplary view illustrating a liquid crystal display device fabricated by using a silicon thin film which is crystallized according to the crystallization method of an embodiment of the present invention.

FIG. 9 is an exemplary view illustrating a liquid crystal display device fabricated by using a silicon thin film crystallized according to a crystallization method according to an embodiment of the present invention.

A thin film transistor formed in the pixel unit can be an N-type or a P-type. The thin film transistor is generally formed with a CMOS structure in which both an N-type thin film transistor and a P-type thin film transistor are formed in the driving circuit unit, but the drawing illustrates the CMOS structure as an example for the purpose of convenience.

A method for fabricating a CMOS liquid crystal display device which is constructed as aforementioned will now be explained.

First, a buffer layer 511 made of a silicon oxide film ($SiO_2$) is formed on a substrate 510 made of a transparent insulating material, such as glass.

Next, active layers 524N and 524P of polycrystalline silicon are formed on the substrate 510 having the buffer layer 511 thereon.

The active layers 524N and 524P are formed of a polycrystalline silicon thin film by depositing an amorphous silicon thin film on the substrate 510 and crystallizing the amorphous silicon film using the lateral solidification process of an embodiment of the present invention. Afterwards, the crystallized polycrystalline silicon thin film is patterned through a photolithography process to form the active patterns 524N and 524P on NMOS and PMOS regions.

Next, a gate insulating layer 525A is deposited on the substrate 510 having the active layers 524N and 524P formed thereon.

Next, gate electrodes 550N and 550P of at least one of molybdenum (Mo), aluminum (Al) and an aluminum alloy are formed on predetermined regions (e.g., channel regions of the active layers 524N and 524P) of the substrate 510 having the gate insulating film 525A deposited thereon.

The gate electrodes 550N and 550P are formed by depositing a gate metal on the entire surface of the substrate 510 having the gate insulating film 525A formed thereon and then by a photolithography process.

Next, an N-type thin film transistor (formed by implanting n+ impurity ions in predetermined regions, such as source/drain regions 522N and 523N, of the active layer 524N) and a P-type thin film transistor (formed by implanting p+ impurity ions in predetermined regions, such as source/drain regions 522P and 523P, of the active layer 524P) are formed by sequentially performing an N-doping process and a P-doping process.

Next, an interlayer insulating film 525B is deposited on the entire surface of the substrate 510, and then contact holes exposing parts of the source/drain regions 522N, 522P, 523N, and 523P are formed using a photolithography process.

Afterwards, source/drain electrodes 551N, 551P, 552N, and 522P electrically connected to the source/drain regions 522N, 522P, 523N, and 523P through the contact holes are formed, thereby completing a CMOS liquid crystal display device as shown in FIG. 9.

Although the above embodiment describes a method for fabricating a liquid crystal display device, the present invention is not limited thereto, and that the principles of the present invention can be applicable to other devices such as an organic EL or the like.

As described so far, by a laser crystallization method and an apparatus thereof according to an embodiment of the present invention, grains with desired crystallization characteristics according to the positions of a glass substrate can be obtained, and accordingly a time taken by the crystallization process can be shortened. As a result, a fabrication yield of a liquid crystal display device can be effectively improved.

It will be apparent to those skilled in the art that various modifications and variations can be made in the crystallization method and the apparatus thereof of the present invention without departing from the spirit or scope of the invention. Thus, it is intended that the present invention cover the modifications and variations of this invention provided they come within the scope of the appended claims and their equivalents.

What is claimed is:

1. A method of crystallizing an amorphous silicon thin film on a substrate, comprising:
   (a) loading a substrate onto a stage, the substrate having an amorphous silicon thin film thereon and having first and second regions, wherein the substrate has a pixel unit corresponding to the first region and a driving circuit unit corresponding to the second region;
   (b) performing a first crystallization to grow a primary grain with a length corresponding to a half of a laser beam width in a width direction of the laser beam by irradiating the laser beam on the first region of the amorphous silicon thin film;
   (c) moving the stage in the width direction of the laser beam by a first distance (D1) in a condition of W/2<D1<W (where, W is a width of the laser beam) and irradiating the laser beam to obtain a secondary grain which has a same length as the first distance, wherein the secondary grain grows from a certain region of the primary grain on which the laser beam is overlapped;
   (d) performing the step of (c) several times to crystallize the entire first region of the amorphous silicon thin film;
   (e) performing a second crystallization to grow a primary grain with a length corresponding to the half of the laser beam width by irradiating the laser beam on the second region of the amorphous silicon thin film;
   (f) moving the stage in the width direction of the laser beam by a second distance (D2) in a condition of 0≦D2≦W/2 and irradiating the laser beam to obtain a secondary grain which has a length adding the second distance and the length of the primary grain; and
   (g) performing the step of (f) repeatedly to obtain a grain having a longer length.

2. The method according to claim 1, wherein the stage moves at one time.

3. The method according to claim 1, wherein the performing the first and second crystallizations are carried out by moving the stage and synchronizing a movement speed of the stage with a triggering of the laser beam.

4. The method according to claim 3, wherein the movement speed of the stage and the triggering of the laser beam are synchronized by using a computer system.

5. The method according to claim 1, wherein the substrate is an array substrate of a liquid crystal display device on which a thin film transistor array is formed.

6. The method according to claim 1, wherein the stage moves along the width direction of the laser beam with a substantially constant speed.

7. The method according to claim 1, wherein the stage moves with different speeds for the first region and the second region.

8. The method of claim 1, wherein the stage moves with a faster speed for the first region than for the second region.

9. The method according to claim 1, wherein the first crystallization is achieved by controlling a triggering of the laser beam to be synchronized with the first distance.

10. The method according to claim 1, wherein the second crystallization is achieved by controlling a triggering of the laser beam to be synchronized with the second distance.

11. The method according to claim 1, wherein the first crystallization is carried out to allow a grain to have the same size as the first distance.

12. The method according to claim 1, wherein the second crystallization is repeatedly carried out to increase a grain size.

13. The method according claim 1, wherein the first crystallization and the second crystallization are carried out by using a sequential lateral solidification for laterally growing grains.

* * * * *